US010976627B2

(12) United States Patent
Tomida (10) Patent No.: US 10,976,627 B2
(45) Date of Patent: Apr. 13, 2021

(54) ACTIVE MATRIX SUBSTRATE AND LIQUID CRYSTAL DISPLAY PANEL COMPRISING SAME

(71) Applicant: Sharp Kabushiki Kaisha, Sakai (JP)

(72) Inventor: Masahiro Tomida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 374 days.

(21) Appl. No.: 15/779,555

(22) PCT Filed: Nov. 21, 2016

(86) PCT No.: PCT/JP2016/084477
§ 371 (c)(1),
(2) Date: May 29, 2018

(87) PCT Pub. No.: WO2017/094548
PCT Pub. Date: Jun. 8, 2017

(65) Prior Publication Data
US 2020/0301182 A1  Sep. 24, 2020

(30) Foreign Application Priority Data

Dec. 1, 2015 (JP) .............................. JP2015-234581

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136286* (2013.01); *H01L 27/1225* (2013.01); *H01L 27/1251* (2013.01)

(58) Field of Classification Search
CPC .................. G02F 1/1368; G02F 1/136286
See application file for complete search history.

(56) References Cited

U.S. PATENT DOCUMENTS

2012/0056646 A1   3/2012  Watanabe et al.
2012/0138922 A1*  6/2012  Yamazaki ........... H01L 29/1033
                                                                            257/43
(Continued)

FOREIGN PATENT DOCUMENTS

JP     2000-298289 A    10/2000
JP     2011-216721 A    10/2011
(Continued)

OTHER PUBLICATIONS

Official Communication issued in International Patent Application No. PCT/JP2016/084477, dated Jan. 17, 2017.

*Primary Examiner* — Dung T Nguyen
(74) *Attorney, Agent, or Firm* — Keating & Bennett, LLP (57) ABSTRACT

An active matrix substrate of an embodiment includes a plurality of TFTs provided in a peripheral circuit region. The plurality of TFTs includes a TFT (10A) in which, when viewed in a direction perpendicular to a substrate (11A), a length in the channel width direction of a source electrode region (15AR) and a length in the channel width direction of a drain electrode region (16AR), WAs and WAd, are each smaller than a length in the channel width direction of the oxide semiconductor layer (14A), WAos, the length in the channel width direction of the oxide semiconductor layer (14A), WAos, is smaller than a length in the channel width direction of a gate electrode (12A), WAg, and a region in which at least one of the source electrode region (15AR) and the drain electrode region (16AR) is in contact with the oxide semiconductor layer(14A) entirely overlaps the gate electrode (12A).

10 Claims, 8 Drawing Sheets

(56) References Cited

U.S. PATENT DOCUMENTS

| | | | |
|---|---|---|---|
| 2012/0146969 A1 | 6/2012 | Sakamoto et al. | |
| 2012/0161126 A1* | 6/2012 | Yamazaki | H01L 27/10873 |
| | | | 257/43 |
| 2012/0319108 A1* | 12/2012 | Sakata | H01L 29/78696 |
| | | | 257/43 |
| 2013/0119373 A1 | 5/2013 | Yamazaki | |
| 2013/0320334 A1* | 12/2013 | Yamazaki | H01L 21/02164 |
| | | | 257/43 |
| 2014/0286076 A1 | 9/2014 | Aoki et al. | |
| 2014/0306220 A1* | 10/2014 | Koezuka | H01L 29/66969 |
| | | | 257/43 |
| 2015/0303309 A1 | 10/2015 | Koezuka et al. | |
| 2016/0358567 A1 | 12/2016 | Tomida et al. | |
| 2018/0356660 A1* | 12/2018 | Tomida | H01L 29/7869 |

FOREIGN PATENT DOCUMENTS

| | | | | |
|---|---|---|---|---|
| JP | 2012-074681 A | 4/2012 | | |
| JP | 2012-134475 A | 7/2012 | | |
| JP | 2013-123045 A | 6/2013 | | |
| JP | 2014-007399 A | 1/2014 | | |
| JP | 2014-209727 A | 11/2014 | | |
| JP | 2015-213165 A | 11/2015 | | |
| WO | 2011/024499 A1 | 3/2011 | | |
| WO | WO-2013080516 A1 * | 6/2013 | | H01L 27/1225 |
| WO | 2015/122393 A1 | 8/2015 | | |

\* cited by examiner

ACTIVE MATRIX SUBSTRATE AND LIQUID CRYSTAL DISPLAY PANEL COMPRISING SAME

TECHNICAL FIELD

The present invention relates to an active matrix substrate and a liquid crystal display panel including the same and particularly to an active matrix substrate and a liquid crystal display panel in which a peripheral circuit includes an oxide semiconductor TFT.

BACKGROUND ART

Liquid crystal display panels which include a thin film transistor in each pixel (hereinafter, also referred to as "pixel TFT"), ranging from small-size panels to large-size panels, have been widely used. Also, a liquid crystal display panel in which a peripheral circuit of the liquid crystal display panel (e.g., gate driver and/or source driver) is monolithically formed has been developed.

The present applicant has manufactured a practical liquid crystal display panel which includes TFTs which include an oxide semiconductor layer (hereinafter, also referred to as "oxide semiconductor TFTs") as pixel TFTs. Further, the present applicant has developed a liquid crystal display panel in which monolithically-formed oxide semiconductor TFTs are used as TFTs of a peripheral circuit (hereinafter, also referred to as "peripheral circuit TFTs").

When oxide semiconductor TFTs are used as the peripheral circuit TFTs, a dielectric breakdown occurs at the time when the peripheral circuit TFTs are turned off, although it does not matter in the pixel TFTs, and there is a probability that the current leakage will increase. This is because a higher source-drain voltage is sometimes applied to the peripheral circuit TFT than to the pixel TFTs.

Patent Document 1 discloses the technique of improving the breakdown voltage of a TFT by using an offset configuration which reduces the overlapping area of the gate electrode and the drain electrode. However, in the TFT disclosed in Patent Document 1, the gate electrode and the drain electrode are arranged offset from each other, and therefore, there is a probability that this arrangement will cause reduction of the on-current. Further, an auxiliary gate electrode is necessary, and accordingly, the area of the TFT disadvantageously increases.

In view of the above, the present applicant discloses in Patent Document 2 the technique of improving the breakdown voltage by arranging a connecting region of the source electrode and the oxide semiconductor (referred to as "source connecting region") and a connecting region of the drain electrode and the oxide semiconductor (referred to as "drain connecting region") into an asymmetrical configuration. According to the technique of Patent Document 2, the problem described above as for Patent Document 1 can be avoided.

Patent Document 3 discloses a TFT suitable to electrostatic protection in which, in a direction perpendicular to the channel length direction (referred to as "channel width direction"), the length (width) of the active layer (oxide semiconductor layer) is greater than the length (width) of the source electrode and the drain electrode, so that the breakdown voltage against the static electricity can be improved (see FIG. 4 of Patent Document 3).

CITATION LIST

Patent Literature

Patent Document No. 1: Japanese Laid-Open Patent Publication No. 2012-74681
Patent Document No. 2: WO 2015/122393
Patent Document No. 3: Japanese Laid-Open Patent Publication No. 2011-216721

SUMMARY OF INVENTION

Technical Problem

When the present inventor applied the TFT configuration disclosed in Patent Document 3 to peripheral circuit TFTs, the breakdown voltage sometimes varied although the breakdown voltage increased.

The present invention was conceived for the purpose of solving the above-described problems. One of the objects of the present invention is to provide an active matrix substrate which includes an oxide semiconductor TFT in which variation of the breakdown voltage is suppressed and a liquid crystal display panel.

Solution to Problem

An active matrix substrate of an embodiment of the present invention is an active matrix substrate including an active region and a peripheral circuit region provided outside the active region. The active matrix substrate includes a substrate and a plurality of TFTs supported by the substrate, wherein the plurality of TFTs include a plurality of first TFTs provided in the active region and a plurality of second TFTs provided in the peripheral circuit region, the plurality of second TFTs include a third TFT, the third TFT includes a gate electrode, an oxide semiconductor layer, a gate insulating layer interposed between the gate electrode and the oxide semiconductor layer, and source and drain electrodes connected with the oxide semiconductor layer, when viewed in a direction perpendicular to the substrate, where a direction in which a source-drain current flows through the oxide semiconductor layer is referred to as a channel length direction, and a direction which is generally perpendicular to the channel length direction is referred to as a channel width direction, a length in the channel width direction of a source electrode region in which the source electrode is in contact with the oxide semiconductor layer and a length in the channel width direction of a drain electrode region in which the drain electrode is in contact with the oxide semiconductor layer are each smaller than a length in the channel width direction of the oxide semiconductor layer, the length in the channel width direction of the oxide semiconductor layer is smaller than a length in the channel width direction of the gate electrode, and at least one of the source electrode region and the drain electrode region entirely overlaps the gate electrode.

In one embodiment, at least one of the source electrode and the drain electrode includes a region which overlaps the gate electrode but does not overlap the oxide semiconductor layer when viewed in a direction perpendicular to the substrate.

In one embodiment, a length in the channel width direction of the source electrode region and a length in the channel width direction of the drain electrode region are substantially equal to each other.

In one embodiment, the oxide semiconductor layer is an n-type semiconductor layer, and at least one of the source electrode region and the drain electrode region only includes the drain electrode region. That is, the drain electrode region of the third TFT entirely overlaps the gate electrode, and part of the source electrode region does not overlap the gate electrode.

In one embodiment, at least one of the source electrode region and the drain electrode region includes the source electrode region and the drain electrode region.

In one embodiment, the active matrix substrate further includes an etch stop layer interposed between the oxide semiconductor layer and the source electrode, and between the oxide semiconductor layer and the drain electrode, wherein the source electrode region and the drain electrode region are each provided in a contact hole of the etch stop layer.

In one embodiment, the peripheral circuit includes a gate driver, and the gate driver includes the third TFT. Only some of the plurality of TFTs included in the gate driver are the third TFTs.

In one embodiment, the plurality of TFTs are channel etch type TFTs.

In one embodiment, the oxide semiconductor layer includes an In—Ga—Zn—O-based semiconductor.

In one embodiment, the oxide semiconductor layer includes an In—Ga—Zn—O-based crystalline semiconductor.

In one embodiment, the oxide semiconductor layer has a multilayer structure.

A liquid crystal display panel of an embodiment of the present invention includes: the active matrix substrate as set forth in any of the precedent paragraphs; a liquid crystal layer; and a counter substrate arranged so as to oppose the active matrix substrate via the liquid crystal layer.

Advantageous Effects of Invention

According to an embodiment of the present invention, an active matrix substrate which includes an oxide semiconductor TFT in which variation of the breakdown voltage is suppressed and a liquid crystal display panel are provided.

BRIEF DESCRIPTION OF DRAWINGS

FIGS. 1(a) and 1(b) are schematic diagrams of a peripheral circuit TFT 10A included in an active matrix substrate of Embodiment 1 of the present invention.

FIGS. 2(a) and 2(b) are schematic diagrams of a peripheral circuit TFT 10B included in an active matrix substrate of Embodiment 2 of the present invention.

FIGS. 3(a) and 3(b) are schematic diagrams of a peripheral circuit TFT 10C included in an active matrix substrate of Embodiment 3 of the present invention.

FIGS. 4(a) and 4(b) are schematic diagrams of a peripheral circuit TFT 10D included in an active matrix substrate of Embodiment 4 of the present invention.

FIG. 8 schematically shows a peripheral circuit TFT 10P included in an active matrix substrate of a comparative example.

DESCRIPTION OF EMBODIMENTS

Hereinafter, an active matrix substrate and a liquid crystal display panel of an embodiment of the present invention are described with reference to the drawings, although the present invention is not limited to the embodiment described below. Particularly, the active matrix substrate is applicable to other display panels, such as organic EL display panels.

Figure 7:
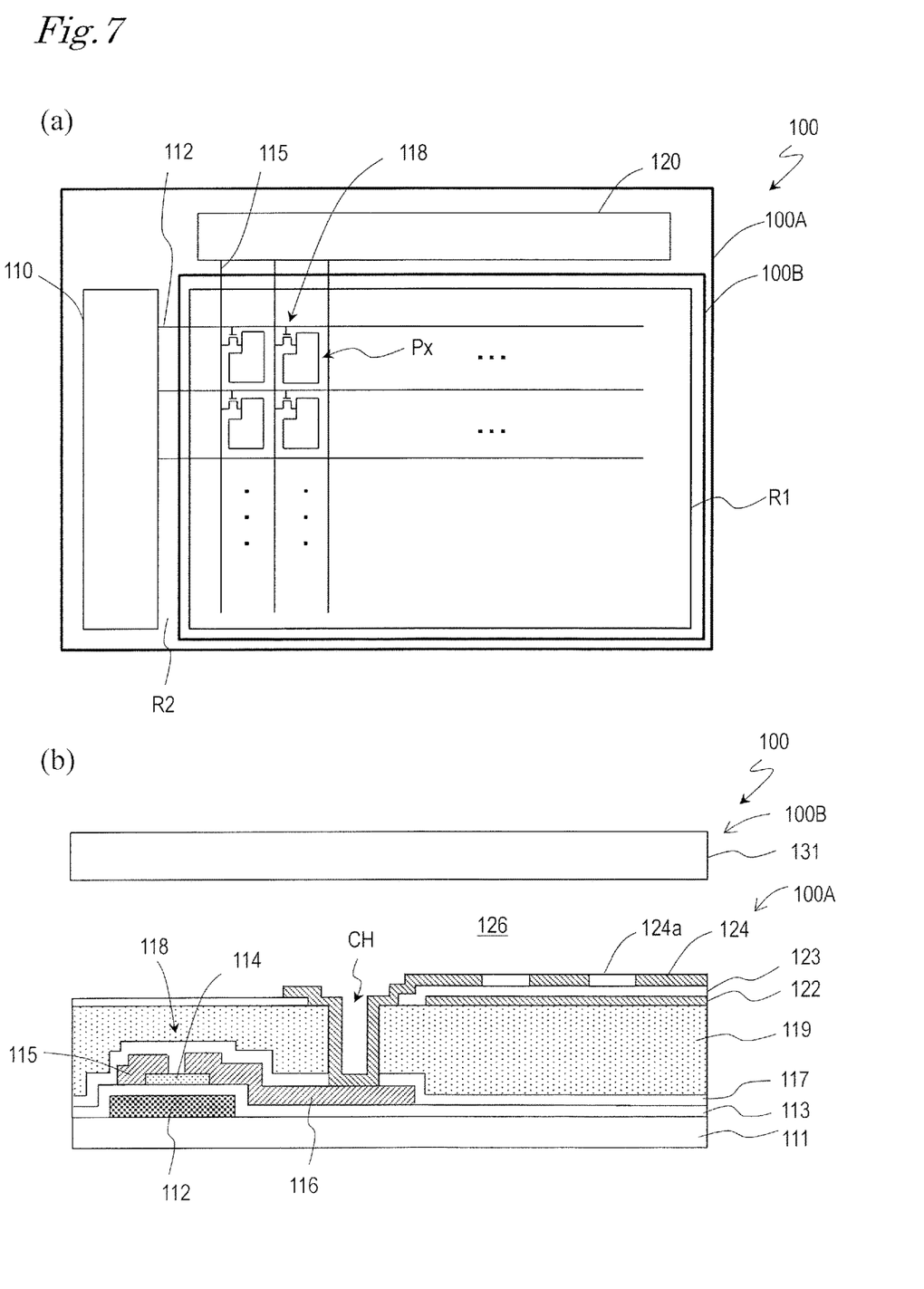
FIG. 7(a) is a schematic plan view showing a liquid crystal display panel 100 of an embodiment of the present invention.
FIG. 7(b) is a schematic cross-sectional view of a portion corresponding to a pixel.

First, the configuration of a liquid crystal display panel 100 of an embodiment of the present invention is described with reference to FIG. 7. FIG. 7(a) is a schematic plan view showing the liquid crystal display panel 100 of an embodiment of the present invention. FIG. 7(b) is a schematic cross-sectional view of a portion corresponding to a pixel. The liquid crystal display panel 100 may have the same configuration as that of a known liquid crystal display panel except that a gate driver 110 includes TFTs which have a configuration which will be described later (e.g., TFTs 10A to 10D). Thus, in the following paragraphs, the configuration of the liquid crystal display panel 100 will be briefly described.

The liquid crystal display panel 100 illustrated herein is a FFS (Fringe Field Switching) mode liquid crystal display panel. The liquid crystal display panel of the present embodiment is not limited to this example but applicable to an IPS (In Plane Switching) mode liquid crystal display panel. The liquid crystal display panel of the present embodiment is not limited to the transverse electric field mode, such as FFS mode and IPS mode, but also applicable to a liquid crystal display panel of the vertical electric field mode (e.g., VA mode and TN mode).

The liquid crystal display panel 100 includes an active matrix substrate 100A, a liquid crystal layer 126, and a counter substrate 100B which is arranged so as to oppose the active matrix substrate 100A via the liquid crystal layer 126.

The liquid crystal display panel 100 includes a display region R1 which is formed by a plurality of pixels Pix arranged in a matrix and a non-display region R2 which is provided outside the display region R1. A region of the active matrix substrate 100A corresponding to the display region R1 is referred to as "active region R1". Another region of the active matrix substrate 100A corresponding to the non-display region R2 is referred to as "peripheral circuit region R2".

The active matrix substrate 100A includes a plurality of pixels Pix in the active region R1. Each pixel Pix includes a pixel electrode 124 which is coupled with a source bus line 115 via a pixel TFT 118. The gate electrode 112 of the pixel TFT 118 is connected with a gate bus line 112. The gate bus line 112 is supplied with a scan signal from the gate driver 110. The source bus line 115 is supplied with a display signal from a source driver 120.

The configuration of the pixel Pix is described with reference to FIG. 7(b).

The pixel TFT 118 is supported by a substrate (e.g., glass substrate) 111. The pixel TFT 118 includes a gate electrode 112 provided on the substrate 111, a gate insulating layer 113 covering the gate electrode 112, a semiconductor layer 114 provided on the gate insulating layer 113, and a source electrode 115 and a drain electrode 116 which are partially in contact with the semiconductor layer 114. The pixel TFT 118 is a bottom gate type TFT. The gate electrode 112 can be integrally formed with the gate bus line 112, and therefore, these components are designated with a common reference numeral. The source electrode 115 can be integrally formed with the source bus line 115, and therefore, these components are designated with a common reference numeral. The pixel TFT 118 is covered with, for example, the passivation layer 117.

An interlayer insulating layer 119 is provided on the passivation layer 117. A counter electrode (also referred to as "common electrode") 122 is provided on the interlayer insulating layer 119. The interlayer insulating layer 119 is, for example, an organic insulating layer and also functions as a flattening film. An inorganic insulating layer 123 is provided on the counter electrode 122. The pixel electrode 124 is provided on the inorganic insulating layer 123. The pixel electrode 124 is in contact with the drain electrode 116 inside a contact hole CH formed in the inorganic insulating layer 123, the interlayer insulating layer 119 and the passivation layer 117. The pixel electrode 124 has a plurality of slits 124a, so that a transverse electric field is generated across the liquid crystal layer 126 according to the potential difference between the pixel electrode 124 and the counter electrode 122. On a surface of the active matrix substrate 100A on the liquid crystal layer 126 side, an unshown alignment film is provided. The counter substrate 100B includes a substrate (e.g., glass substrate) 131, a color filter layer and a black matrix (both not shown). On a surface of the counter substrate 100B on the liquid crystal layer 126 side, an unshown alignment film is provided.

In the peripheral circuit region R2 of the active matrix substrate 100A, the gate driver 110 and the source driver 120 are provided. At least the gate driver 110 is monolithically formed on the substrate 111. The source driver 120 may be monolithically formed on the substrate 111 or may be mounted in the form of an IC. In the peripheral circuit region R2, other circuits and wires can be provided in addition to the gate driver 110 and the source driver 120.

The peripheral circuits TFT of the gate driver 110 can be formed through the same process as that for the pixel TFTs. For example, when oxide semiconductor TFTs are used as the pixel TFTs 118, the peripheral circuit TFTs can be realized by oxide semiconductor TFTs. In an example described in the following paragraphs, oxide semiconductor TFTs are used as the peripheral circuit TFTs of the gate driver 110.

Figure 1:
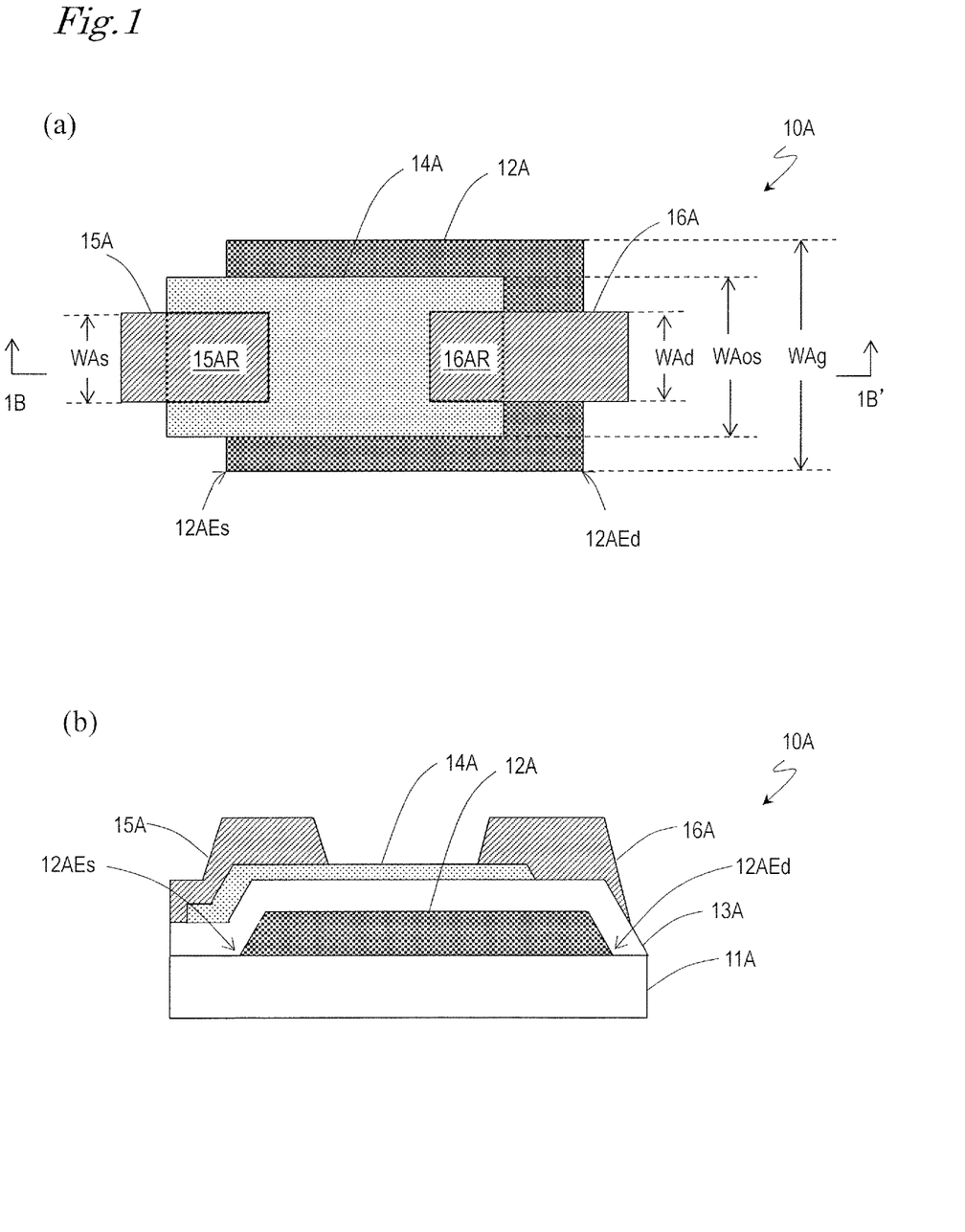
FIG. 1(a) is a plan view.
FIG. 1(b) is a cross-sectional view taken along line 1B-1B' of FIG. 1(a).

The pixel TFTs and the peripheral circuit included in the active matrix substrate of the embodiment of the present invention may each be of the channel etch type or the etch stop type. In a "channel etch type TFT", for example, as shown in FIG. 1, an etch stop layer is not provided on a channel region, and the lower surface of a channel-side end portion of the source and drain electrodes is in contact with the upper surface of the oxide semiconductor layer. The channel etch type TFT can be formed by, for example, forming an electrically-conductive film for source and drain electrodes on an oxide semiconductor layer and performing source-drain separation. In the source-drain separation step, a surface portion of the channel region is etched away in some cases. Meanwhile, in a TFT in which an etch stop layer is provided on the channel region (etch stop type TFT), the lower surface of a channel-side end portion of the source and drain electrodes is present on, for example, the etch stop layer. The etch stop type TFT can be formed by, for example, forming an etch stop layer so as to cover part of an oxide semiconductor layer which is to be the channel region and, thereafter, forming an electrically-conductive film for source and drain electrodes on the oxide semiconductor layer and the etch stop layer and performing source-drain separation.

Figure 8:
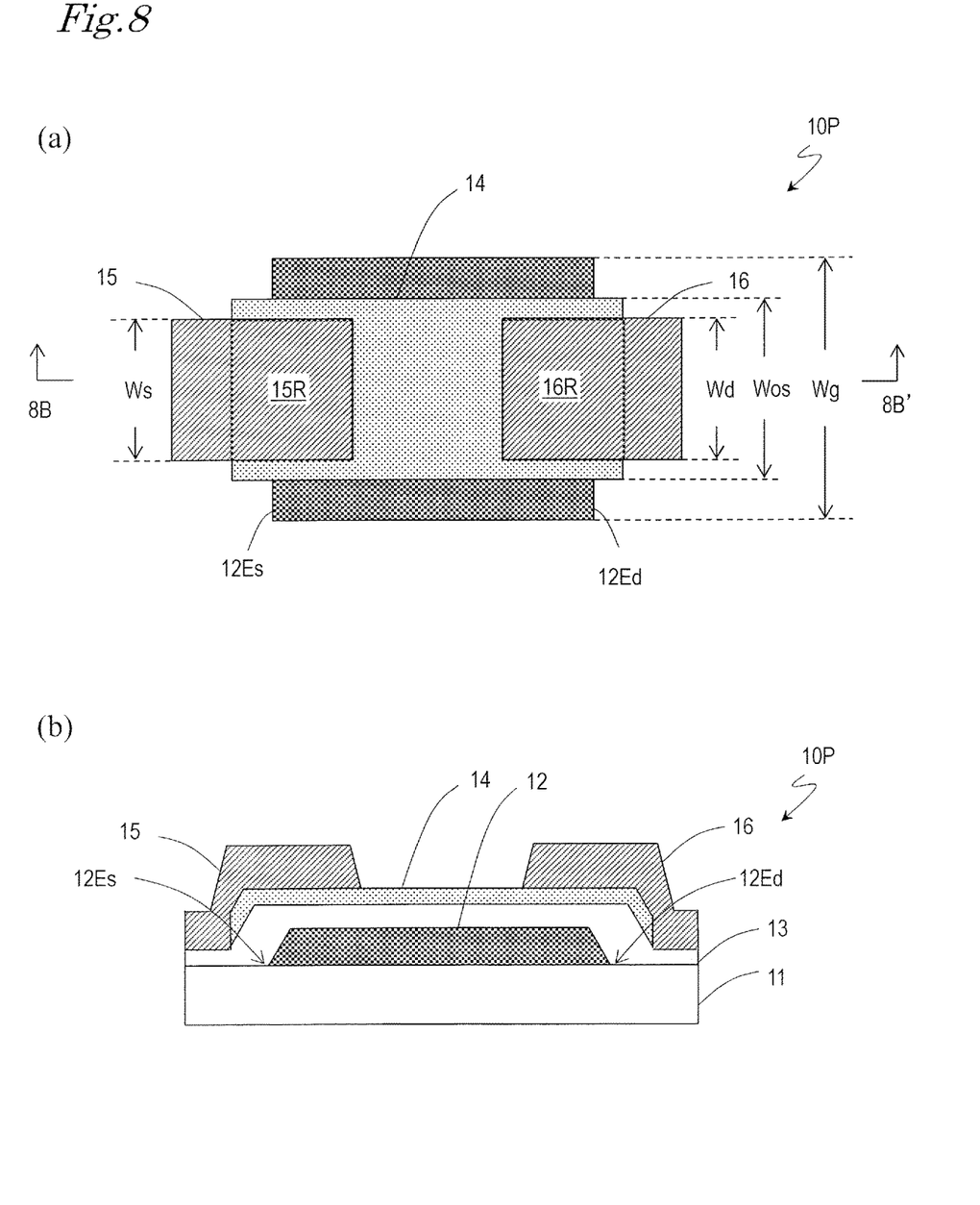
FIG. 8(a) is a plan view.
FIG. 8(b) is a cross-sectional view taken along line 8B-8B' of FIG. 8(a).

The problem to be solved by the embodiment of the present invention is described with reference to FIG. 8. FIG. 8 is a schematic diagram of a peripheral circuit TFT 1op included in an active matrix substrate of a comparative example. FIG. 8(a) is a plan view of the TFT 10P. FIG. 8(b) is a cross-sectional view taken along line 8B-8B' of FIG. 8(a). The active matrix substrate of the comparative example has the same configuration as that of the active matrix substrate 100A except for the configuration of the peripheral circuit TFTs.

The TFT 10P is realized by applying to the peripheral circuit TFTs such a configuration that the width of the oxide semiconductor layer is greater than the width of the source electrode and the drain electrode (see FIG. 4 of Patent Document 3). Patent Document 3 discloses that such a configuration that the width of the oxide semiconductor layer is smaller than the width of the source electrode and the drain electrode (see FIG. 3 of Patent Document 3) has a smaller capacitance and is therefore more suitable to a driving circuit. However, according to the research by the present inventor, when using such a configuration that the width of the oxide semiconductor layer is greater than the width of the source electrode and the drain electrode, the breakdown voltage can be increased, and the margin for misalignment can also be increased.

The TFT 10P is supported by a substrate 11. The TFT 10P includes a gate electrode 12 provided on the substrate 11, a gate insulating layer 13 covering the gate electrode 12, an oxide semiconductor layer 14 provided on the gate insulating layer 13, and a source electrode 15 and a drain electrode 16 which are partially in contact with the oxide semiconductor layer 14. The TFT 10P is also a bottom gate type TFT. When necessary, the TFT 10P is covered with a passivation layer (not shown). In this specification, a region in which the source electrode 15 is in contact with the oxide semiconductor layer 14 is referred to as "source electrode region 15R", and a region in which the drain electrode 16 is in contact with the oxide semiconductor layer 14 is referred to as "drain electrode region 16R".

When viewed in a direction perpendicular to the substrate 11, a direction in which a source-drain current flows through the oxide semiconductor layer 14 is referred to as "channel length direction", and a direction which is generally perpendicular to the channel length direction is referred to as "channel width direction". As shown in FIG. 8(a), the length in the channel width direction of the source electrode 15 (=the length in the channel width direction of the source electrode region 15R), Ws, and the length in the channel width direction of the drain electrode 16 (=the length in the channel width direction of the drain electrode region 16R), Wd, are each smaller than the length in the channel width direction of the oxide semiconductor layer 14, Wos. The length in the channel width direction of the oxide semiconductor layer 14, Wos, is smaller than the length in the channel width direction of the gate electrode 12, Wg.

The overlap of the source electrode 15 with the oxide semiconductor layer 14 and the gate electrode 12 and the overlap of the drain electrode 16 with the oxide semiconductor layer 14 and the gate electrode 12 are now discussed. Each of the source electrode 15 and the drain electrode 16 includes a region overlapping both the gate electrode 12 and the oxide semiconductor layer 14, a region overlapping only the oxide semiconductor layer 14, and a region overlapping none of the gate electrode 12 and the oxide semiconductor layer 14. These regions sequentially occur outward from the channel region (a region between the source electrode 15 and the drain electrode 16). The oxide semiconductor layer 14 overlaps an edge 12Es of the gate electrode 12 on the source electrode 15 side and an edge 12Ed of the gate electrode 12 on the drain electrode 16 side. Each of the source electrode 15 and the drain electrode 16 also overlaps the edge 12Es of the gate electrode 12 on the source electrode 15 side and the edge 12Ed of the gate electrode 12 on the drain electrode 16 side. That is, the source electrode region 15R in which the source electrode 15 is in contact with the oxide semiconductor layer 14 only partially overlaps the gate electrode 12 and includes a region not overlapping the gate electrode 12. Likewise, the drain electrode region 16R in which the drain electrode 16 is in contact with the oxide semiconductor layer 14 only partially overlaps the gate electrode 12 and includes a region not overlapping the gate electrode 12.

Thus, as shown in FIG. 8(b), the oxide semiconductor layer 14 is arranged so as to cover a tapered portion (slope) which forms the edge 12Es of the gate electrode 12, and the source electrode 15 is further provided. Likewise, the oxide semiconductor layer 14 is arranged so as to cover a tapered portion (slope) which forms the edge 12Ed of the gate electrode 12, and the drain electrode 16 is further provided.

With the above-described multilayer structure, when the oxide semiconductor layer 14 is an n-type semiconductor layer, there is a probability that application of a high voltage to the drain electrode 16 will cause dielectric breakdown in the gate insulating layer 13 that covers a tapered portion which includes the edge 12Ed of the gate electrode 12, and a leakage current flows between the gate electrode 12 and the drain electrode 16. A portion of the gate insulating layer 13 covering the tapered portion of the gate electrode 12 is likely to have a smaller thickness than another portion of the gate insulating layer 13 overlying a flat portion, and therefore, the breakdown voltage is likely to vary due to variations in manufacture. Therefore, a large number of TFTs 10P included in the gate driver 110 have varying drain breakdown voltages. Accordingly, current leakage occurs in some TFTs 10P of the gate driver 110, and as a result, the gate driver 110 would sometimes not normally operate. Although the same problem can occur on the source electrode 15 side, the source voltage is lower than the drain voltage in many cases in the gate driver, and therefore, improving at least the breakdown voltage on the drain electrode 16 side is preferred. The circuit operation can be configured such that a high voltage is not applied to the source electrode 15 side.

When the oxide semiconductor layer 14 is a p-type semiconductor layer, the above-described problem occurs on the source electrode 15 side. In the peripheral circuit TFTs, a side into which carriers enter is referred to as "source", and the other side from which carriers go out is referred to as "drain". In the pixel TFTs, irrespective of the conductivity type of the semiconductor layer, a side connected with the source bus line 115 is referred to as "source", and the other side is referred to as "drain", according to convention.

The active matrix substrate 100A of the embodiment of the present invention includes, for example, a peripheral circuit TFT 10A shown in FIG. 1 to FIG. 4. Although in the following paragraphs an example of use of the n-type oxide semiconductor is described, it is appreciated by those skilled in the art that the following description is also applicable to a case where a p-type oxide semiconductor is used.

FIG. 1 shows schematic diagrams of a peripheral circuit TFT 10A included in the active matrix substrate of Embodiment 1 of the present invention. FIG. 1(a) is a plan view of the TFT 10A. FIG. 1(b) is a cross-sectional view taken along line 1B-1B' of FIG. 1(a).

The TFT 10A is supported by a substrate 11A. The TFT 10A includes a gate electrode 12A provided on the substrate 11A, a gate insulating layer 13A covering the gate electrode 12A, an oxide semiconductor layer 14A provided on the gate insulating layer 13A, and a source electrode 15A and a drain electrode 16A which are partially in contact with the oxide semiconductor layer 14A.

As shown in FIG. 1(a), the length in the channel width direction of the source electrode 15A (=the length in the channel width direction of a source electrode region 15AR), WAs, and the length in the channel width direction of the drain electrode 16A (=the length in the channel width direction of the drain electrode region 16AR), WAd, are each smaller than the length in the channel width direction of the oxide semiconductor layer 14A, WAos. The length in the channel width direction of the oxide semiconductor layer 14A, WAos, is smaller than the length in the channel width direction of the gate electrode 12A, WAg.

The multilayer structure on the source electrode 15A side is the same as that of the TFT 10P of the comparative example shown in FIG. 8. The source electrode region 15AR only partially overlaps the gate electrode 12A and includes a region not overlapping the gate electrode 12A. Meanwhile, the drain electrode region 16AR entirely overlaps the gate electrode 12A. That is, the drain electrode region 16AR does not include a region not overlapping the gate electrode 12A.

As clearly seen from FIG. 1(b), the oxide semiconductor layer 14A overlaps an edge 12AEs of the gate electrode 12A on the source electrode 15A side, and the source electrode 15A also overlaps the edge 12AEs of the gate electrode 12A on the source electrode 15A side, while the oxide semiconductor layer 14A does not overlap an edge 12AEd of the gate electrode 12A on the drain electrode 16A side.

Since the TFT 10A has the above-described multilayer structure on the drain electrode 16A side, the breakdown voltage on the drain electrode 16A side is higher than in the TFT 10P, and variation of the breakdown voltage is suppressed. The length in the channel width direction of the source electrode region 15AR, WAs, and the length in channel width direction of the drain electrode region 16AR, WAd, are substantially equal to each other. Herein, being "substantially equal" refers to being equal within the patterning accuracy and means that a variation in the TFT characteristics due to the difference between WAs and WAd is not found. If WAs and WAd are substantially equal to each other, a high voltage can be applied to both the source electrode 15A and the drain electrode 16A, and the flexibility in setting the voltage that drives the TFT advantageously improves.

The TFT 10A satisfies the relationship of WAs, WAd<WAos<WAg. The respective dimensions are specified below. Note that the channel length refers to the shortest distance between the source electrode region 15AR and the drain electrode region 16AR.

Channel Length: not less than 1 μm and not more than 100 μm

WAs, WAd (independently): not less than 1 μm and not more than 100 μm

WAos: not less than 2 μm and not more than 101 μm

WAg: not less than 3 μm and not more than 102 μm

The TFT 10A is a so-called channel etch type TFT. The TFT 10A can be manufactured through, for example, a process which will be described below. The channel etch process is well known and is therefore briefly described in the following paragraphs.

First, a gate metal layer (a metal layer of Mo, Ti, Al, Ta, Cr, Au, or the like) is formed on a glass substrate 11A by sputtering so as to have a thickness of 100 nm to 300 nm. The gate metal layer may have a multilayer structure (e.g., Ti/Al/Ti). The gate metal layer is patterned through a photolithography process, whereby a gate electrode 12A is formed. In this step, wires such as gate bus lines are also formed.

Then, as a gate insulating layer 13A, for example, a $SiO_2$ layer or a $SiN_x$ layer is formed by plasma CVD at 300° C. to 400° C. so as to have a thickness of 300 nm to 400 nm. The gate insulating layer 13A may be a multilayer structure consisting of a $SiO_2$ layer and a $SiN_x$ layer.

Then, an oxide semiconductor layer (e.g., an In—Ga—Zn—O-based semiconductor layer, an In—Zn—O-based semiconductor layer, a ZnO-based semiconductor layer) is formed by sputtering at 200° C. to 400° C. so as to have a thickness of 40 nm to 50 nm. Thereafter, inert argon gas Ar (100 sccm to 300 sccm) and oxygen gas $O_2$ (5 sccm to 20 sccm) may be supplied into a chamber of a sputtering apparatus. The oxide semiconductor layer may be formed by application. The resultant oxide semiconductor layer is photolithographically patterned, whereby an oxide semiconductor layer 14A which has a predetermined pattern is obtained.

Then, a source metal layer (a metal layer of Mo, Ti, Al, Ta, Cr, Au, or the like) is formed by sputtering so as to have a thickness of 100 nm to 300 nm. The source metal layer may have a multilayer structure (e.g., Ti/Al/Ti). The source metal layer is patterned through a photolithography process, whereby a source electrode 15A and a drain electrode 16A which have predetermined shapes are formed. In this step, wires such as source bus lines are also formed. In this way, the TFT 10A is formed.

A passivation layer which covers the TFT 10A (corresponding to the passivation layer 117 of FIG. 7(b)) may be formed. The passivation layer can be realized by, for example, forming a $SiO_2$ layer or a $SiN_x$ layer by plasma CVD at 200° C. to 300° C. so as to have a thickness of 200 nm to 300 nm. The passivation layer may have a multilayer structure consisting of a $SiO_2$ layer and a $SiN_x$ layer.

Thereafter, when necessary, a heat treatment is performed at 200° C. to 400° C. in dry air or atmospheric air for 1 hour to 2 hours. This heat treatment can improve the TFT characteristics.

Through the above-described process for manufacture of the peripheral circuit TFT 10A, the pixel TFT 118 shown in FIG. 7(b) can be formed concurrently.

Figure 2:
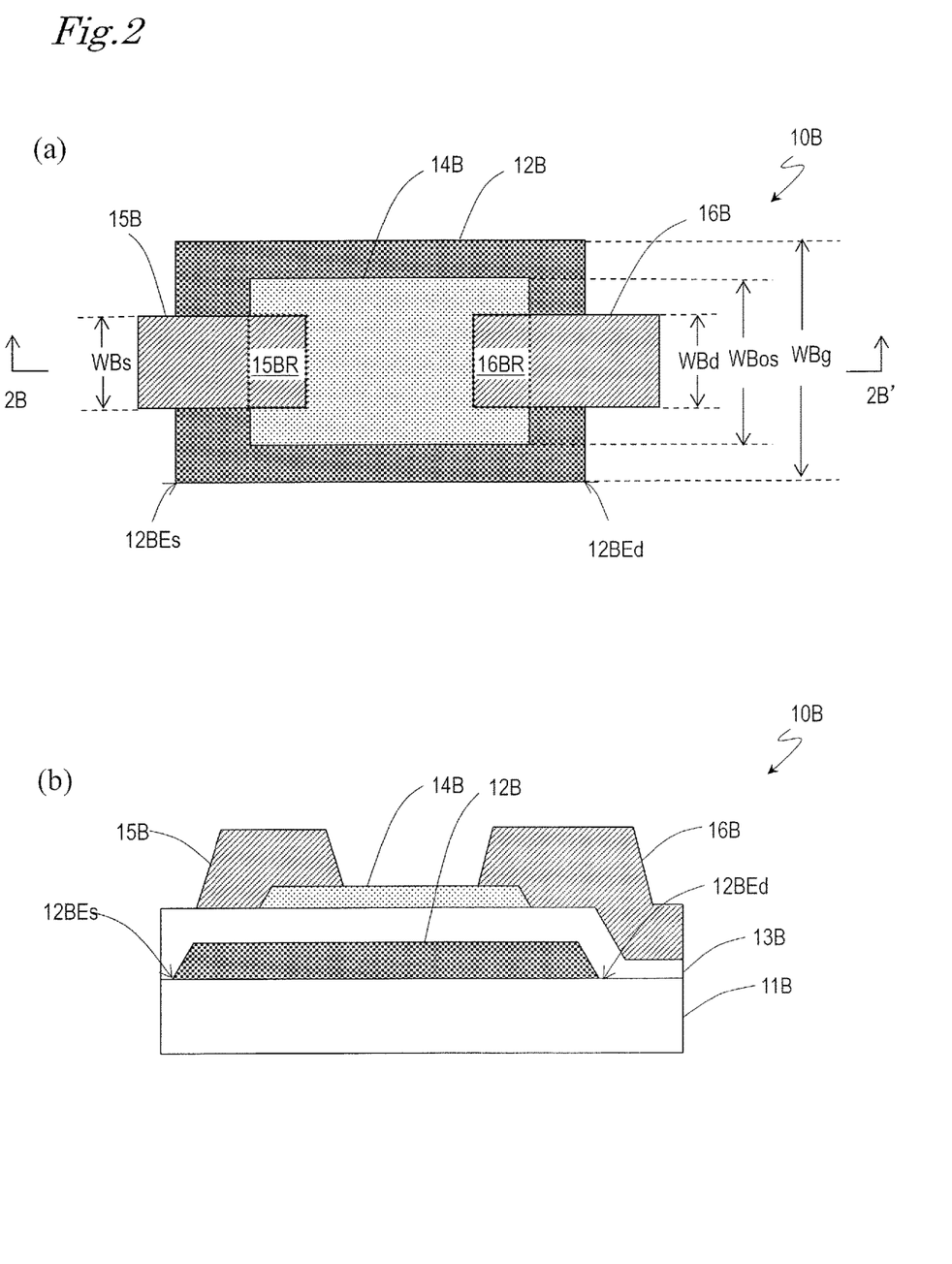
FIG. 2(a) is a plan view.
FIG. 2(b) is a cross-sectional view taken along line 2B-2B' of FIG. 2(a).

FIG. 2 shows schematic diagrams of a peripheral circuit TFT 10B included in an active matrix substrate of Embodiment 2 of the present invention. FIG. 2(a) is a plan view of the TFT 10A. FIG. 2(b) is a cross-sectional view taken along line 2B-2B' of FIG. 2(a).

The TFT 10B is supported by a substrate 11B. The TFT 10B includes a gate electrode 12B provided on the substrate 11B, a gate insulating layer 13B covering the gate electrode 12B, an oxide semiconductor layer 14B provided on the gate insulating layer 13B, and a source electrode 15B and a drain electrode 16B which are partially in contact with the oxide semiconductor layer 14B.

As shown in FIG. 2(a), the length in the channel width direction of the source electrode 15B (=the length in the channel width direction of a source electrode region 15BR), WBs, and the length in the channel width direction of the drain electrode 16B (=the length in the channel width direction of the drain electrode region 16BR), WBd, are each smaller than the length in the channel width direction of the oxide semiconductor layer 14B, WBos. The length in the channel width direction of the oxide semiconductor layer 14B, WBos, is smaller than the length in the channel width direction of the gate electrode 12B, WBg.

The TFT 10B is different from the TFT 10A in that the multilayer structure on the source electrode 15B side is the same as the multilayer structure on the drain electrode 16B side.

The drain electrode region 16BR entirely overlaps the gate electrode 12B. That is, the drain electrode region 16BR does not include a region not overlapping the gate electrode 12B. Likewise, the source electrode region 15BR also entirely overlaps the gate electrode 12B. That is, the source electrode region 15BR also does not include a region not overlapping the gate electrode 12B.

As clearly seen from FIG. 2(b), the oxide semiconductor layer 14B overlaps none of an edge 12BEd of the gate electrode 12B on the drain electrode 16B side and an edge 12BEs of the gate electrode 12B on the source electrode 15B side.

Since the TFT 10B has the above-described multilayer structure not only on the drain electrode 16B side but also on the source electrode 15B side, the breakdown voltage on the drain electrode 16B side and the breakdown voltage on the source electrode 15B side are higher than in the TFT 10P, and variation of the breakdown voltages is suppressed. Since the length in the channel width direction of the source electrode region 15BR, WBs, and the length in the channel width direction of the drain electrode region 16BR, WBd, are substantially equal to each other, the flexibility in setting the voltage that drives the TFT advantageously improves as in the TFT 10A.

The TFT 10B also satisfies the relationship of WBs, WBd<WBos<WBg. The respective dimensions are the same as those of the TFT 10A. The TFT 10B can be manufactured through a channel etch process as the TFT 10A can be.

The configuration of a TFT 10C of Embodiment 3 and the configuration of a TFT 10D of Embodiment 4 are described with reference to FIG. 3 and FIG. 4. The TFT 10C corresponds to the TFT 10A. The TFT 10D corresponds to the TFT 10B. The TFT 10C and the TFT 10D are different from the TFT 10A and the TFT 10B in that the TFT 10C and the TFT 10D are manufactured through a manufacturing process in which an etch stop layer is used.

Figure 3:
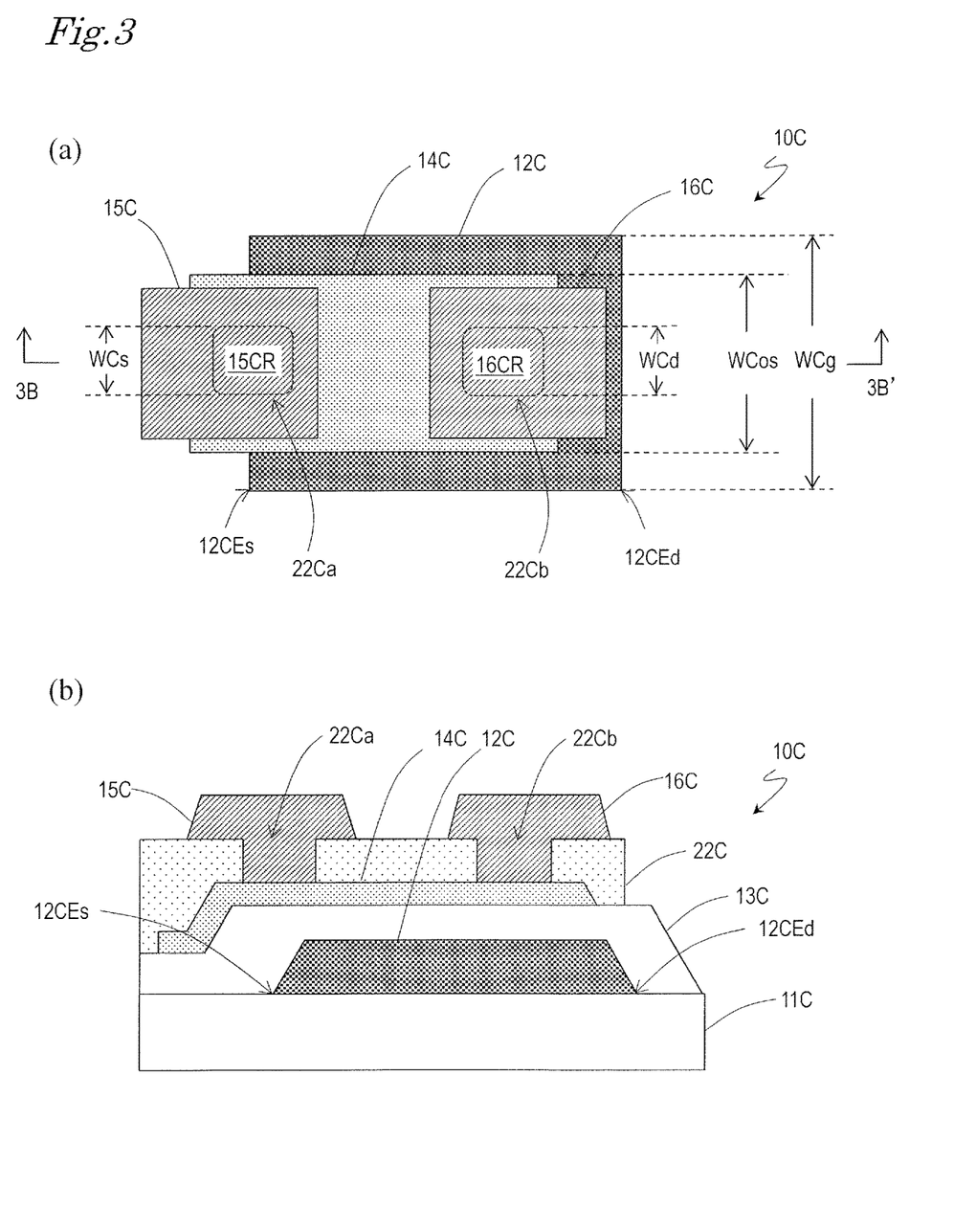
FIG. 3(a) is a plan view.
FIG. 3(b) is a cross-sectional view taken along line 2C-2C' of FIG. 3(a).

FIG. 3 shows schematic diagrams of a peripheral circuit TFT 10C included in an active matrix substrate of Embodiment 3 of the present invention. FIG. 3(a) is a plan view of the TFT 10C. FIG. 3(b) is a cross-sectional view taken along line 3B-3B' of FIG. 3(a).

As shown in FIG. 3(a), the length in the channel width direction of a source electrode region 15CR, WCs, and the length in the channel width direction of the drain electrode region 16CR, WCd, are each smaller than the length in the channel width direction of the oxide semiconductor layer 14C, WCos. The length in the channel width direction of the oxide semiconductor layer 14C, WCos, is smaller than the length in the channel width direction of the gate electrode 12C, WCg.

As shown in FIG. 3(b), the TFT 10C further includes an etch stop layer 22C interposed between the oxide semiconductor layer 14C and a source electrode 15C and, between the oxide semiconductor layer 14C and a drain electrode 16C. The source electrode 15C and the drain electrode 16C are in contact with the oxide semiconductor layer 14C inside the contact holes 22Ca and 22Cb, respectively, of the etch stop layer 22C. That is, the source electrode region 15CR and the drain electrode region 16CR are provided in the contact holes 22Ca and 22Cb, respectively, of the etch stop layer 22C.

In the TFT 10C, the source electrode region 15CR only partially overlaps the gate electrode 12C and includes a region not overlapping the gate electrode 12C, while the drain electrode region 16CR entirely overlaps the gate electrode 12C, as in the TFT 10A. That is, the drain electrode region 16CR does not include a region not overlapping the gate electrode 12C.

Since the TFT 10C has the above-described multilayer structure on the drain electrode 16B side, the breakdown voltage on the drain electrode 16B side is higher than in the TFT 10P, and variation of the breakdown voltage is suppressed. Since the length in the channel width direction of the source electrode region 15CR, WCs, and the length in the channel width direction of the drain electrode region 16CR, WCd, are substantially equal to each other, the flexibility in setting the voltage that drives the TFT advantageously improves as in the TFT 10A.

The TFT 10C also satisfies the relationship of WCs, WCd<WCos<WCg. The respective dimensions are the same as those of the TFT 10A.

The TFT 10C is a so-called etch stop type TFT. The TFT 10C can be manufactured through, for example, a process which will be described below. The etch stop process is well known and is therefore briefly described in the following paragraphs.

Through the same process as that for the TFT 10A of Embodiment 1, a gate electrode 12C, a gate insulating layer 13C and an oxide semiconductor layer 14C are formed on a substrate 11C.

Thereafter, an insulating layer which is to be an etch stop layer 22C is formed so as to cover a portion of the oxide semiconductor layer 14 which is to be the channel region. For example, a $SiO_2$ layer is formed by plasma CVD at 300 to 400° C. so as to have a thickness of 100 nm to 400 nm. In the $SiO_2$ layer, contact holes 22Ca, 22Cb are formed by photolithography at predetermined positions, whereby the etch stop layer 22C is obtained.

Thereafter, through the same process as that for the TFT 10A, a source electrode 15C and a drain electrode 16C are formed. In this step, wires such as source bus lines are also formed. In this way, the TFT 10C is formed. When necessary, a passivation layer may be formed so as to cover the TFT 10C. Also, when necessary, a heat treatment may be performed.

Figure 4:
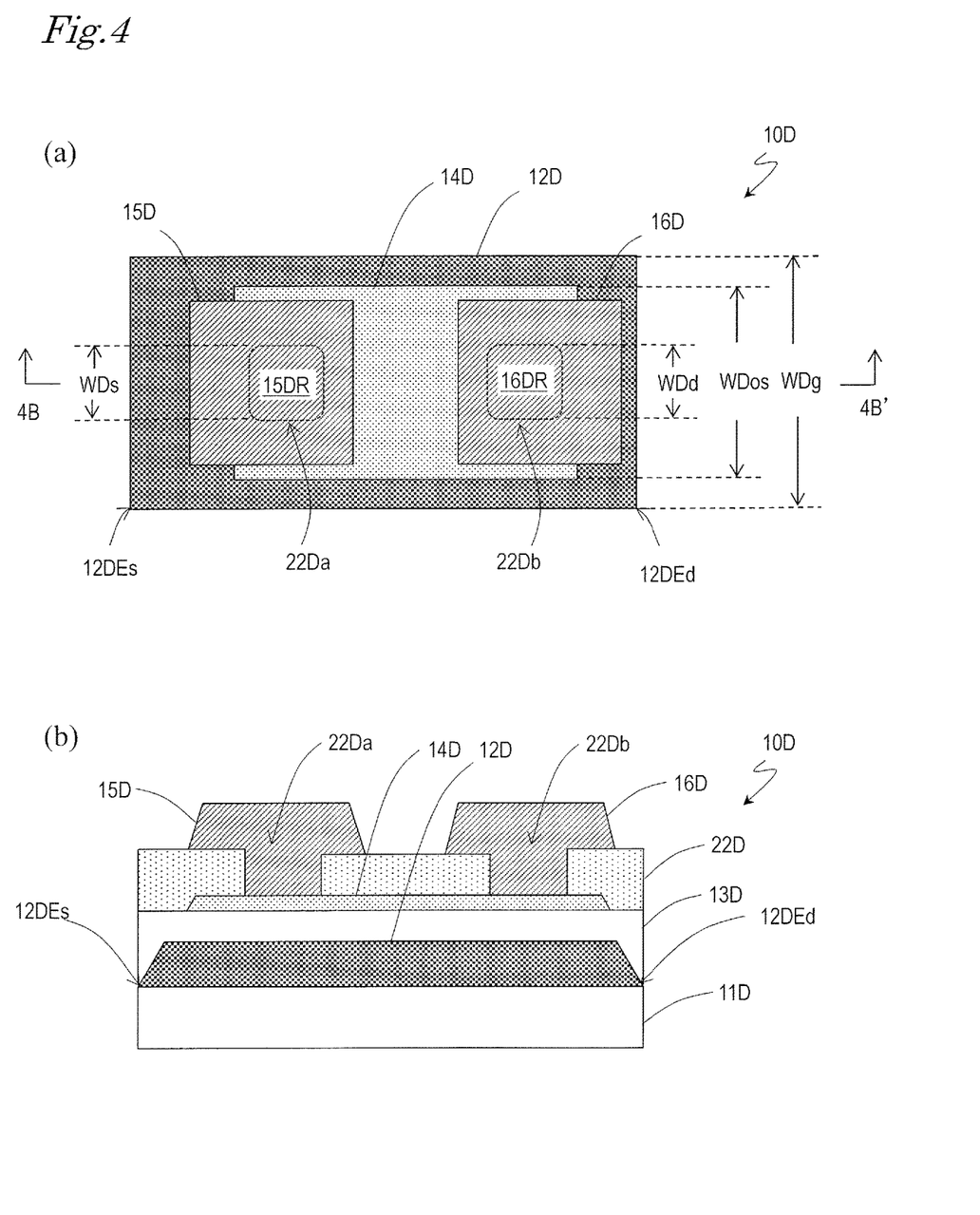
FIG. 4(a) is a plan view.
FIG. 4(b) is a cross-sectional view taken along line 2D-2D' of FIG. 4(a).

FIG. 4 shows schematic diagrams of a peripheral circuit TFT 10D included in an active matrix substrate of Embodiment 4 of the present invention. FIG. 4(a) is a plan view of the TFT 10D. FIG. 4(b) is a cross-sectional view taken along line 4B-4B' of FIG. 4(a).

As shown in FIG. 4(a), the length in the channel width direction of a source electrode region 15DR, WDs, and the length in the channel width direction of the drain electrode region 16DR, WDd, are each smaller than the length in the channel width direction of the oxide semiconductor layer 14D, WDos. The length in the channel width direction of the oxide semiconductor layer 14D, WDos, is smaller than the length in the channel width direction of the gate electrode 12D, WDg.

As shown in FIG. 4(b), the TFT 10D further includes an etch stop layer 22D interposed between the oxide semiconductor layer 14D and a source electrode 15D, and between the oxide semiconductor layer 14D and a drain electrode 16D. The source electrode 15D and the drain electrode 16D are in contact with the oxide semiconductor layer 14D inside the contact holes 22Da and 22Db, respectively, of the etch stop layer 22D. That is, the source electrode region 15DR and the drain electrode region 16DR are provided in the contact holes 22Da and 22Db, respectively, of the etch stop layer 22D.

In the TFT 10D, the multilayer structure on the source electrode 15D side is also the same as the multilayer structure on the drain electrode 16D side as in the TFT 10B.

The drain electrode region 16DR entirely overlaps the gate electrode 12D. That is, the drain electrode region 16DR does not include a region not overlapping the gate electrode 12D. Likewise, the source electrode region 15DR also entirely overlaps the gate electrode 12D. That is, the source electrode region 15DR also does not include a region not overlapping the gate electrode 12D.

Since the TFT 10D has the above-described multilayer structure not only on the drain electrode 16D side but also on the source electrode 15D side, the breakdown voltage on the drain electrode 16D side and the breakdown voltage on the source electrode 15D side are higher than in the TFT 10P, and variation of the breakdown voltages is suppressed. Since the length in the channel width direction of the source electrode region 15DR, WDs, and the length in the channel width direction of the drain electrode region 16DR, WDd, are substantially equal to each other, the flexibility in setting the voltage that drives the TFT advantageously improves as in the TFT 10A.

The TFT 10D also satisfies the relationship of WDs, WDd<WDos<WDg. The respective dimensions are the same as those of the TFT 10A. The TFT 10D can be manufactured through an etch stop process as the TFT 10C can be.

In the active matrix substrate 100A of the embodiment of the present invention, only some of a plurality of TFTs provided in the peripheral circuit region which need a high breakdown voltage at least on the drain electrode side need to have the above-described configuration. For example, in a shift register included in the gate driver, the above-described configuration only needs to be applied to various TFTs whose drain is connected with the gate of a TFT which is designed so as to be turned on by a bootstrap (e.g., output buffer transistor).

Figure 5:
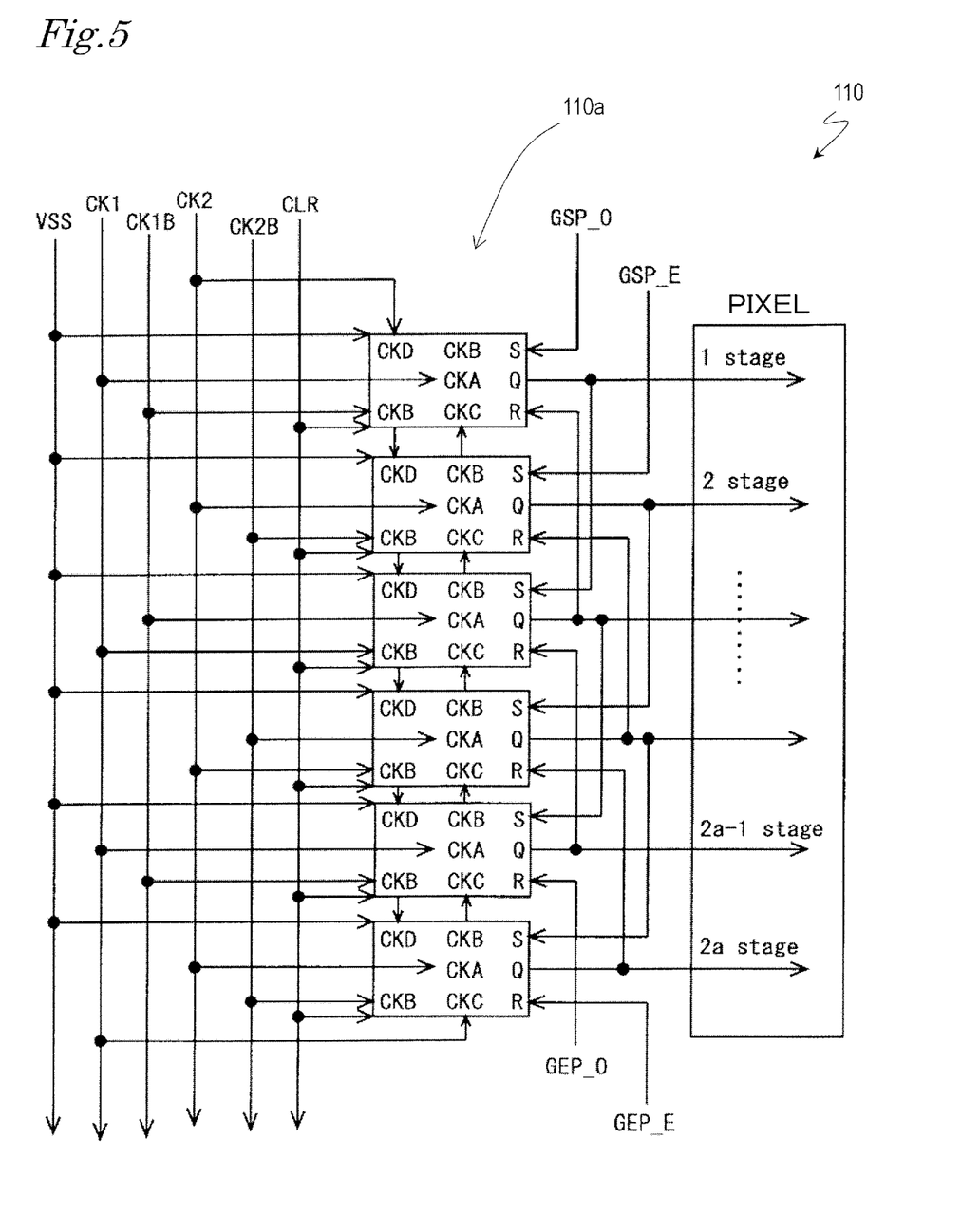
FIG. 5 is a circuit diagram showing a gate driver 110 included in an active matrix substrate 100A of an embodiment of the present invention.
Figure 6:
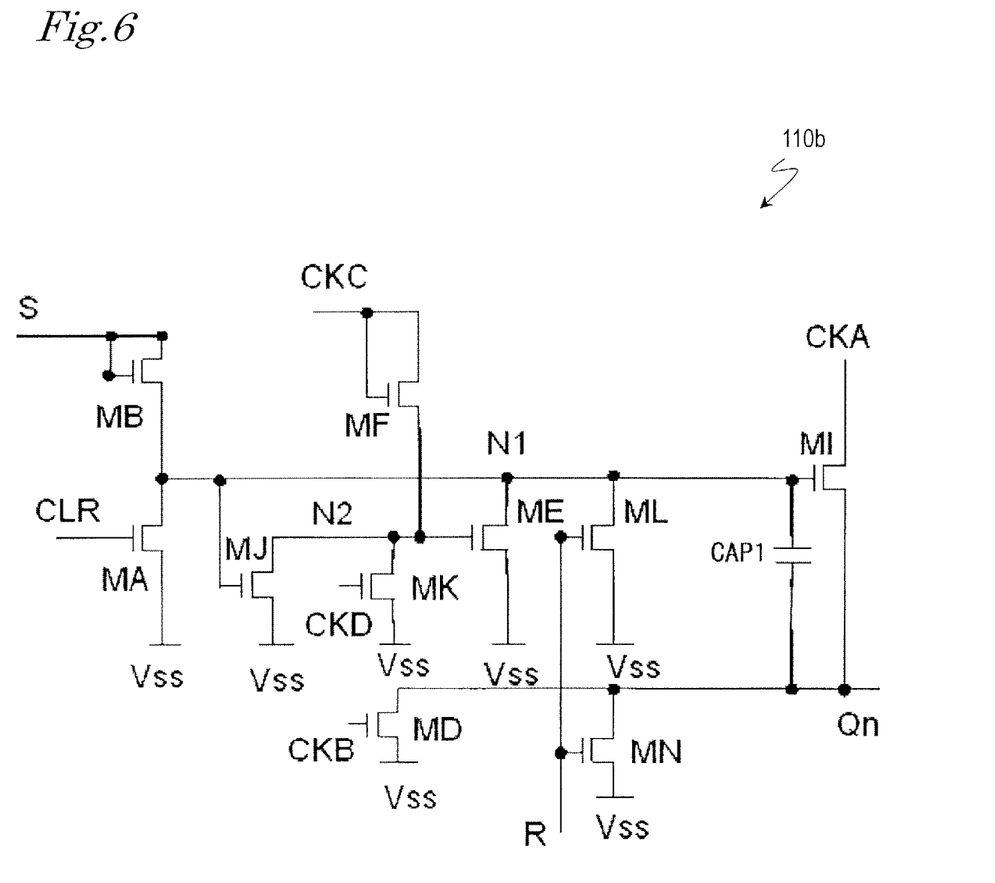
FIG. 6 is a circuit diagram showing a bistable circuit 110b included in the gate driver 110.

A configuration example of the gate driver 110 is described with reference to FIG. 5 and FIG. 6. The same configuration as that of the gate driver 110 shown in FIG. 5 and FIG. 6 is disclosed in WO 2011/024499. The entire disclosure of WO 2011/024499 is incorporated by reference in this specification.

FIG. 5 is a circuit diagram showing a gate driver 110 included in the active matrix substrate 100A of the embodiment of the present invention. FIG. 6 is a circuit diagram showing a bistable circuit 110b included in the gate driver 110.

As shown in FIG. 5, the gate driver 110 includes a plurality of stages of shift registers 110a. The shift registers 110a of respective stages correspond to respective rows of the pixel matrix.

For example, when there are 2a pixel rows, the shift registers 110a include 2a bistable circuits 110b. Each of the bistable circuits 110b is capable of alternately outputting the two stable states according to a trigger signal. Each of the bistable circuits 110b includes input terminals for receiving four-phase clock signals CKA, CKB, CKC, CKD, an input terminal for receiving set signal S, an input terminal for receiving reset signal R, an input terminal for receiving clear signal CLR, an input terminal for receiving low-potential DC voltage VSS, and an output terminal for outputting state signal Q.

In the outer perimeter portion of the peripheral circuit region, main wires for the gate clock signals (first gate clock signal CK1, second gate clock signal CK1B, third gate clock signal CK2, and fourth gate clock signal CK2B), a main wire for low-potential DC voltage VSS, and a main wire for clear signal CLR are provided.

As shown in FIG. 6, the bistable circuit 110b includes ten TFTs (MA, MB, MI, MF, MJ, MK, ME, ML, MN and MD) and a capacitor CAP1. The bistable circuit 110b also includes input terminals for receiving clock signals CKA, CKB, CKC, CKD, an input terminal for receiving set signal S, an input terminal for receiving reset signal R, an input terminal for receiving clear signal CLR, and an output terminal OUT for outputting state signal Qn.

The source terminal of the TFT-MB, the drain terminal of the TFT-MA, the gate terminal of the TFT-MJ, the drain terminal of the TFT-ME, the drain terminal of the TFT-ML, the gate terminal of the TFT-MI, and one end of the capacitor CAP1 are coupled with one another. Note that a wire portion via which these elements are coupled with one another is referred to as "first node" for the sake of convenience and is designated with the symbol "N1" in the drawing.

The drain terminal of the TFT-MJ, the drain terminal of the TFT-MK, the source terminal of the TFT-MF, and the gate terminal of the TFT-ME are coupled with one another. Note that a wire portion via which these elements are coupled with one another is referred to as "second node" for the sake of convenience and is designated with the symbol "N2" in the drawing.

In this configuration, the TFT-MA shown on the left-hand side of the drawing sets the potential of the first node N1 to a low level when clear signal CLR is at a high level. Meanwhile, the TFT-MB sets the potential of the first node N1 to a high level when set signal S is at a high level.

The TFT-MI shown on the right-hand side of the drawing functions as an output buffer transistor and supplies the potential of first clock signal CKA to the output terminal when the potential of the first node N1 is at a high level. The TFT-MF shown in the upper central part of the drawing sets the potential of the second node N2 to a high level when the third clock signal CKC is at a high level.

The TFT-MJ sets the potential of the second node N2 to a low level when the potential of the first node N1 is at a high level. During a period when a gate bus line coupled with the output terminal OUT of this bistable circuit 110b is selected, if the second node N2 is at a high level so that the TFT-ME is in an ON state, the potential of the first node N1 decreases so that the TFT-MI is in an OFF state. To prevent such a phenomenon, the TFT-MJ is provided.

The TFT-MK sets the potential of the second node N2 to a low level when the fourth clock signal CKD is at a high level. If the TFT-MK is not provided, the potential of the second node N2 is always at a high level except for the selected period, and a bias voltage is incessantly applied to the TFT-ME. Accordingly, the threshold voltage of the TFT-ME increases, so that the TFT-ME does not sufficiently function as a switch. To prevent such a phenomenon, the TFT-MK is provided.

The TFT-ME sets the potential of the first node N1 to a low level when the potential of the second node N2 is at a high level. The TFT-ML sets the potential of the first node N1 to a low level when reset signal R is at a high level. The TFT-MN sets the potential of the output terminal to a low level when reset signal R is at a high level. The TFT-MD sets the potential of the output terminal OUT to a low level when the second clock CKB is at a high level. The capacitor CAP1 functions as a compensatory capacitance for maintaining the potential of the first node N1 at a high level during a period when a gate bus line coupled with the output terminal OUT of this bistable circuit 110b is selected.

In this configuration, the first node N1 shown in FIG. 6 is a node whose potential is to be boosted by a bootstrap to a level not less than the supply voltage. In this circuit configuration, the bootstrap means the operation of turning on the output buffer transistor MI with utilization of voltage application to the gate terminal via a parasitic capacitance due to the increase of the source potential of the output buffer transistor MI and accumulation of electricity in the capacitor CAP1 while the gate voltage is kept raised to a potential exceeding set signal S.

The drain sides of the TFTs-MA, ME, ML that pull down the first node N1 are coupled with the first node N1, and the source sides of the TFTs-MA, ME, ML are coupled with VSS. During the bootstrap operation, when the first node N1 transitions to a high voltage, each of the TFTs-MA, ME, ML is in an OFF state, and furthermore, a high voltage is applied between the drain and the source. In this case, if each of the TFTs-MA, ME, ML has a short channel length and a low off-breakdown voltage, a normal OFF state cannot be retained. As a result, the potential of the first node N1 decreases so that the selection/non-selection operation by the driver can fail.

Clock signal CKA whose DUTY ratio is 50% is input to the drain terminal of the output buffer transistor MI. When this stage is not selected, clock signal CKA should not be output as state signal Qn. If the off-breakdown voltage of this transistor MI is low, the voltage of clock signal CKA is output as state signal Qn even when this stage is not selected. This can be the cause of an erroneous operation.

Thus, the above-described TFTs are required to have a high breakdown voltage. When the channel length is increased, the off-breakdown voltage of the TFTs have a tendency to increase so that the operation of the driver can be easily secured, while the area of the TFTs increases and the layout area of the gate driver also increases. This leads to an increase of the external dimensions of the display panel, so that the demand for size reduction of the device cannot be satisfied.

In view of the above, the TFTs 10A to 10D shown in FIG. 1 to FIG. 4 can be used as a TFT which is required to have off-breakdown tolerance. In this case, the off-breakdown voltage can be improved without increasing the size of the device. Note that, as the TFTs-MD, MF, MN that are not particularly required to have off-breakdown tolerance, the TFT 10p of the comparative example shown in FIG. 8 may be used.

The configuration of the gate driver 110 which has been described herein is exemplary. As a matter of course, the gate driver 110 may have a different configuration. In such a case, the TFTs 10A to 10D can be used as an arbitrary TFT in the gate driver to which a high voltage can be applied at the drain side when it is off. For example, the TFTs 10A to 10D used are such a TFT that the voltage applied to the drain side when the TFT is off can be 20 V to 60 V.

An oxide semiconductor layer of an oxide TFT included in the active matrix substrate 100A of the embodiment of the present invention is described. The following description is common to the oxide semiconductor layers of the pixel TFTs and the peripheral circuit TFTs.

The oxide semiconductor included in the oxide semiconductor layer may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The oxide semiconductor layer may have a multilayer structure consisting of two or more layers. When the oxide semiconductor layer has a multilayer structure, the oxide semiconductor layer may include a non-crystalline oxide semiconductor layer and a crystalline oxide semiconductor layer. Alternatively, the oxide semiconductor layer may include a plurality of crystalline oxide semiconductor layers which have different crystalline structures. The oxide semiconductor layer may include a plurality of non-crystalline oxide semiconductor layers. When the oxide semiconductor layer has a two-layer structure which includes the upper layer and the lower layer, it is preferred that the energy gap of the oxide semiconductor included in the upper layer is greater than the energy gap of the oxide semiconductor included in the lower layer. Note that, however, when the difference in energy gap between these layers is relatively small, the energy gap of the oxide semiconductor of the lower layer may be greater than the energy gap of the oxide semiconductor of the upper layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer may include, for example, at least one metal element among In, Ga and Zn. In the present embodiment, the oxide semiconductor layer includes, for example, an In—Ga—Zn—O-based semiconductor (e.g., indium gallium zinc oxide). Here, the In—Ga—Zn—O-based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer which has such a composition can be formed by an oxide semiconductor film which includes an In—Ga—Zn—O-based semiconductor. Note that a channel-etch type TFT which includes an active layer which includes an oxide semiconductor, such as an In—Ga—Zn—O-based semiconductor, is also referred to as "CE-OS-TFT".

The In—Ga—Zn—O-based semiconductor may be amorphous or may be crystalline. As the crystalline In—Ga—Zn—O-based semiconductor, a crystalline In—Ga—Zn—O-based semiconductor in which the c-axis is oriented generally perpendicular to the layer surface is preferred.

The crystalline structure of the crystalline In—Ga—Zn—O-based semiconductor is disclosed in, for example, Japanese Laid-Open Patent Publication No. 2014-007399 that has previously been mentioned, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O-based semiconductor layer has high mobility (20 times or more as compared with an a-Si TFT) and low current leakage (less than 1/100 as compared with an a-Si TFT), and is therefore suitably used as a peripheral circuit TFT and a pixel TFT.

The oxide semiconductor layer may include a different oxide semiconductor instead of the In—Ga—Zn—O-based semiconductor. For example, the oxide semiconductor layer may include an In—Sn—Zn—O-based semiconductor (e.g., $In_2O_3$—$SnO_2$—$ZnO$; InSnZnO). The In—Sn—Zn—O-based semiconductor is a ternary oxide including In (indium), Sn (tin) and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

INDUSTRIAL APPLICABILITY

The present invention is suitably applicable to, for example, an active matrix substrate of a display panel, such as a liquid crystal display panel.

REFERENCE SIGNS LIST

10A TFT
11A substrate
12A gate electrode
13A gate insulating layer
14A oxide semiconductor layer
15A source electrode
15AR source electrode region
16A drain electrode
16AR drain electrode region
100 liquid crystal display panel
100A active matrix substrate

The invention claimed is:

1. An active matrix substrate including an active region and a peripheral circuit region provided outside the active region, the active matrix substrate comprising:
   a substrate; and
   a plurality of TFTs supported by the substrate, wherein
   the plurality of TFTs include a plurality of first TFTs provided in the active region and a plurality of second TFTs provided in the peripheral circuit region,
   the plurality of second TFTs include a third TFT,
   the third TFT includes a gate electrode, an oxide semiconductor layer, a gate insulating layer interposed between the gate electrode and the oxide semiconductor layer, and source and drain electrodes connected with the oxide semiconductor layer, when viewed in a direction perpendicular to the substrate, where a direction in which a source-drain current flows through the oxide semiconductor layer is referred to as a channel length direction, and a direction which is generally perpendicular to the channel length direction is referred to as a channel width direction, a length in the channel width direction of a source electrode region in which the source electrode is in contact with the oxide semiconductor layer and a length in the channel width direction of a drain electrode region in which the drain electrode is in contact with the oxide semiconductor layer are each smaller than a length in the channel width direction of the oxide semiconductor layer, the length in the channel width direction of the oxide semiconductor layer is smaller than a length in the channel width direction of the gate electrode, the drain electrode region entirely overlaps the gate electrode, and the source electrode region does not entirely overlap the gate electrode, and the oxide semiconductor layer is an n-type semiconductor layer.

2. The active matrix substrate of claim 1, wherein at least one of the source electrode and the drain electrode includes a region which overlaps the gate electrode but does not overlap the oxide semiconductor layer when viewed in a direction perpendicular to the substrate.

3. The active matrix substrate of claim 1, wherein a length in the channel width direction of the source electrode region and a length in the channel width direction of the drain electrode region are substantially equal to each other.

4. The active matrix substrate of claim 1, further comprising an etch stop layer interposed between the oxide semiconductor layer and the source electrode, and between the oxide semiconductor layer and the drain electrode, wherein the source electrode region and the drain electrode region are each provided in a contact hole of the etch stop layer.

5. The active matrix substrate of claim 1, wherein the peripheral circuit includes a gate driver, and the gate driver includes the third TFT.

6. The active matrix substrate of claim 1, wherein the plurality of TFTs are channel etch type TFTs.

7. The active matrix substrate of claim 1, wherein the oxide semiconductor layer includes an In—Ga—Zn—O-based semiconductor.

8. The active matrix substrate of claim 1, wherein the oxide semiconductor layer includes an In—Ga—Zn—O-based crystalline semiconductor.

9. The active matrix substrate of claim 1, wherein the oxide semiconductor layer has a multilayer structure.

10. A liquid crystal display panel, comprising:
the active matrix substrate as set forth in claim 1;
a liquid crystal layer; and
a counter substrate arranged so as to oppose the active matrix substrate via the liquid crystal layer.

* * * * *